United States Patent
Yang

(10) Patent No.: US 9,761,484 B1
(45) Date of Patent: Sep. 12, 2017

(54) INTERCONNECT STRUCTURE AND FABRICATION THEREOF

(71) Applicant: International Business Machines Corporation, Armonk, NY (US)

(72) Inventor: Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/218,322

(22) Filed: Jul. 25, 2016

(51) Int. Cl.
| | | |
|---|---|---|
| H01L 21/768 | (2006.01) |
| H01L 21/321 | (2006.01) |
| H01L 23/528 | (2006.01) |
| H01L 21/3115 | (2006.01) |

(52) U.S. Cl.
CPC .... *H01L 21/76868* (2013.01); *H01L 21/3212* (2013.01); *H01L 21/76814* (2013.01); *H01L 21/76843* (2013.01); *H01L 21/76864* (2013.01); *H01L 21/76867* (2013.01); *H01L 21/76871* (2013.01); *H01L 23/5283* (2013.01); *H01L 21/31155* (2013.01)

(58) Field of Classification Search
CPC .... H01L 21/76841–21/76864; H01L 21/3212; H01L 21/76871–21/76873; H01L 21/76867–21/76868
See application file for complete search history.

(56) References Cited

U.S. PATENT DOCUMENTS

| | | |
|---|---|---|
| 6,491,978 B1 | 12/2002 | Kalyanam |
| 6,528,180 B1 | 3/2003 | Lee et al. |
| 6,680,538 B2 | 1/2004 | Kim et al. |
| 6,736,701 B1 | 5/2004 | Shue et al. |
| 6,783,868 B2 | 8/2004 | Ciotti et al. |
| 6,910,947 B2 | 6/2005 | Paik |
| 6,913,938 B2 | 7/2005 | Shanmugasundram et al. |
| 6,919,636 B1 | 7/2005 | Ryan |
| 6,936,843 B2 | 8/2005 | Cui |
| 6,950,716 B2 | 9/2005 | Ward et al. |
| 6,952,052 B1 | 10/2005 | Marathe et al. |
| 6,961,626 B1 | 11/2005 | Paik |
| 6,999,836 B2 | 2/2006 | Schwarm et al. |
| 7,040,956 B2 | 5/2006 | Paik |
| 7,069,101 B1 | 6/2006 | Arackaparambil et al. |
| 7,272,459 B2 | 9/2007 | Kokotov et al. |
| 7,333,871 B2 | 2/2008 | Schwarm |

(Continued)

*Primary Examiner* — Thanhha Pham
(74) *Attorney, Agent, or Firm* — Cantor Colburn LLP; Louis Percello

(57) ABSTRACT

Interconnect structures and processes generally include creating point defects in exposed surfaces of the dielectric layer to create a point defect region at a relatively shallow depth, wherein the point defect region is a fraction of the dielectric layer and is created with exposure to silicon, carbon, nitrogen, oxygen, or mixtures thereof such that the point defect region contains Si, C, N O, or mixtures containing at least one of the foregoing. A seed layer can be deposited and includes at least one alloying element that is effective to form an in situ self-aligned liner layer with the Si, C, N O, or mixtures containing at least one of the foregoing within the point defect region, which is formed at a depth of less than 10 nanometers. The in situ liner layer within the dielectric layer maximizes the volume fraction of the conductor of the interconnect structure.

12 Claims, 6 Drawing Sheets

(56) References Cited

U.S. PATENT DOCUMENTS

| | | |
|---|---|---|
| 7,337,019 B2 | 2/2008 | Reiss et al. |
| 7,349,753 B2 | 3/2008 | Paik |
| 7,354,332 B2 | 4/2008 | Surana et al. |
| 2011/0079909 A1* | 4/2011 | Furuya ................ H01L 21/2885 257/762 |

* cited by examiner

INTERCONNECT STRUCTURE AND FABRICATION THEREOF

BACKGROUND

The present invention generally relates to semiconductor integrated circuits, and more particularly, to the structure and formation of liner structures that create insulation and diffusion barriers for a metal conductor.

An integrated circuit (IC) generally includes a semiconductor substrate in which a number of device regions are formed by diffusion or ion implantation of suitable dopants. This substrate usually involves a passivating and an insulating layer required to form different device regions. The total thickness of these layers is usually less than one micron. Openings through these layers (called vias or contact holes) and trenches therein allow electrical contact to be made selectively to the underlying device regions. A conducting material such as copper is used to fill these holes, which then make contact to semiconductor devices.

The openings are typically lined with a liner material, i.e., a barrier layer, to prevent migration of the conducting material into the dielectric material, which can lead to electrical short circuits, rendering the circuit unusable. As the dimensions of semiconductor devices shrink in the quest to improve chip performance, proportional scaling of the interconnect dimensions is needed. However, the barrier layer in the feature sidewalls (both vias and trenches) maintains a required minimum thickness of 10 to 20 Angstroms. As a result, the volume fraction occupied by the liner layer in the interconnect structure dramatically increases and degrades the circuit performance, i.e., the cross-sectional area of the conductor is significantly reduced by the presence of the liner layer.

SUMMARY

The invention is generally directed to methods and interconnect structures that maximize the volume fraction of the conductor within the interconnect structure. In one or more embodiments, a method for forming an interconnect structure in an integrated circuit includes providing a patterned substrate comprising an opening in a dielectric layer, wherein the opening includes sidewalls formed of the dielectric layer and a bottom surface including a source region or a drain region or a metal gate or the dielectric layer. Point defects are created in exposed surfaces of the dielectric layer to create a point defect region, wherein the point defect region is a fraction of the dielectric layer and is created with exposure to silicon, carbon, nitrogen, oxygen, or mixtures thereof such that the point defect region contains Si, C, N O, or mixtures containing at least one of the foregoing. A seed layer is then deposited onto the point defect region, wherein the seed layer comprises at least one alloying element. Following deposition of the seed layer, a conductor layer is deposited onto the seed layer. The patterned substrate is annealed to form an in situ liner layer in the point defect region of the dielectric layer from the at least one alloying element and Si, C, N O, or mixtures containing at least one of the foregoing.

In one or more embodiments, an interconnect structure for an integrated circuit, includes a patterned dielectric layer comprising at least one opening, the at least one opening including a bottom surface, and sidewalls extending from the bottom surface to a top surface, wherein the bottom surface is defined by a source region or a drain region or a metal gate or the dielectric layer; an in situ liner layer formed within the dielectric layer; a seed layer conformally deposited into the at least one opening of the patterned dielectric layer; and a conductor layer overlaying the seed layer and filling the at least one opening; wherein the in situ liner layer comprises a reaction byproduct of one or more of Si, C, N, O with an alloying element in the seed layer.

In one or more interconnect structure for an integrated circuit includes a patterned dielectric layer comprising at least one opening, the at least one opening including a bottom surface, and sidewalls extending from the bottom surface to a top surface, wherein the bottom surface is defined by a source region or a drain region or a metal gate or the dielectric layer; an in situ self-aligned liner layer formed within the dielectric layer; a conformal liner layer deposited onto the in situ liner layer having a thickness less than 40 Angstroms; a conformal seed layer on surfaces defined by the at least one opening of the patterned dielectric layer; and a conductor layer overlaying the seed layer and filling the at least one opening; wherein the in situ liner layer comprises a reaction byproduct of one or more of Si, C, N, O with an alloying element in the seed layer.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

Figure 1A:
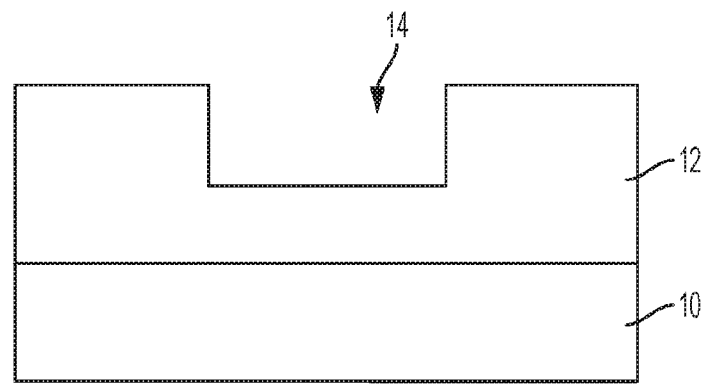
FIG. 1A depicts a schematic cross-sectional view illustrating an opening in the form of a trench formed in a dielectric layer according to one or more embodiments.

The detailed description explains the preferred embodiments of the invention, together with advantages and features, by way of example with reference to the drawings.

DETAILED DESCRIPTION

The present invention generally provides interconnect structures and processes for forming a liner layer suitable for contact formation. The structures and processes generally include forming point defects in the dielectric material and subsequently forming a liner layer within the area defined by the point defects. Advantageously, the liner layer can be formed within the dielectric layer, thereby maximizing metal conductor volume as well as eliminating or reducing volume fraction occupied by the liner layer.

The point defects penetrate into the surface at a relative small fraction of the exposed dielectric layer and are created with simultaneous exposure to silicon (Si), carbon (C), nitrogen (N), oxygen (O) and mixtures thereof such that the small fraction of the exposed dielectric layer defined by the point defects contains Si, C, N O, and mixtures thereof. Subsequent processing including deposition of a seed layer for the metal conductor and annealing steps results in formation of the liner layer. For example, a typical seed layer for copper metal interconnects can include aluminum (Al), manganese (Mn), nickel (Ni), or mixtures thereof, wherein the aluminum, manganese, nickel, and mixtures thereof diffuse into the region defined by the point defects and can react with the silicon (Si), carbon (C), nitrogen (N), oxygen (O) and mixtures thereof upon annealing so as to form an effective liner layer within the dielectric layer as well as maintain effectiveness of the seed layer for metal conductor deposition and adhesion. Additionally, in one or more embodiments, a copper alloy seed containing with aluminum (Al), manganese (Mn), nickel (Ni), or mixtures thereof is provided. Advantageously, the so-formed liner layer is conformal and self-aligned to the topography previously provided in the dielectric layer and provides an effective barrier to metal conductor diffusion into the dielectric layer.

As used herein, the term "point defect" generally refers to a defect in the dielectric material that facilitates diffusion of seeding layer components within the region defined by the point defects at a markedly greater rate than diffusion in the bulk dielectric layer. For example, the point defects created into a relative small fraction of the exposed dielectric layer can be in the form of pores or cracks or the like. While the depth of the point defects is not intended to be limited, in one or more embodiments, the point defect penetration into the exposed surfaces of the dielectric layer is less than 10 nanometers (nm). In one or more other embodiments, the point defect penetration into the surface of the dielectric layer is less than 5 nm, and in still other embodiments, the point defect penetration into the surface of the dielectric layer is about 0.5 nm to about 3 nm.

The point defects can be created using a low energy particle bombardment process at energies of about 0.1 electron volts (eV) to about 200 kilo-electron volts (key) depending on the process. The particles can be electrically neutral. Exemplary low energy particle bombardment processes include, but are not limited to, an accelerated neutral atom beam (ANAB) process at energies generally at about 10 eV to about 100 eV, an ion implantation process at energies generally at about 20 keV to about 200 keV, a plasma bombardment process at energies generally at about 0.1 keV to about 2 keV, a gas cluster ion beam (GCIB) process at energies generally at about 10 keV to about 30 about keV, and the like. Apart from creating the point defects at relatively shallow depths within the dielectric layer, the low energy particle bombardment processes can act as a carrier to provide Si, C, N O, and mixtures thereof within the region defined by the point defects. As noted above, these materials can then react with various seed layer components such as Mn and Al to form an in situ the liner layer for the metal conductor used in the interconnect structure.

In GCIB processes, the dielectric surface is bombarded by a beam of high energy nanoscale cluster ions. The clusters are formed when a high pressure gas (approximately 10 atmospheres pressure) expands into a vacuum (1e-5 atmospheres). The gas expands adiabatically and cools then condenses into clusters. The clusters are nanosized bits of crystalline matter with unique properties intermediate between the realms of atomic physics and those of solid state physics. The expansion takes place inside of a nozzle that shapes the gas flow and facilitates the formation of a jet of clusters. The jet of clusters passes through differential pumping apertures into a region of high vacuum (1e-8 atmospheres) where the clusters are ionized by collisions with energetic electrons. The ionized clusters are accelerated electrostatically to very high velocities, and are focused into a tight beam.

In ANAB, a beam of accelerated gas cluster ions is initially produced as described in GCIB, but the gas cluster is caused to dissociate and a deflector removes the charge. Released neutral atoms then continue to travel collectively with the same velocities they had prior to being released. An electrostatic deflector is used to eliminate all residual charged species from the beam. Upon target impact, the accelerated neutral atom beams produce surface modification comparable to those associated with GCIB.

Similarly, ion implantation or plasma bombardment can be used to create point defects within the dielectric layer with electrically neutral particles and can facilitate simultaneous deposition of Si, C, N O, and mixtures thereof within the region defined by the point defects.

Referring now to FIGS. 1A-1H, there is shown a process and the resulting interconnect structure including an in situ liner layer formed within an open trench formed in the dielectric layer in accordance with one or more embodiments of the invention. It should be noted that the present invention is also applicable to liners formed within via structures formed in the dielectric layer.

As shown in FIG. 1A, the process generally includes first forming an opening, e.g., a trench feature 14 and/or via feature (not shown) in a dielectric layer (e.g., an interlevel dielectric layer (ILD)) 12 deposited on a substrate 10 and patterned through conventional lithography and etching processes. The lithographic step generally includes applying a photoresist to the surface of the dielectric layer, exposing the photoresist to a desired pattern of radiation, and developing the exposed photoresist utilizing a conventional resist developer to form a pattern. The etching process can then transfer the pattern into the underlying dielectric layer. The etching process can be a dry etching or wet etching process.

The term "wet etching" generally refers to application of a chemical solution. This is preferably a time controlled dip in the etch solution. Preferred etch solutions include $HNO_3$, HCL, $H_2SO_4$, HF or combinations thereof.

The term "dry etching" is used here to denote an etching technique such as reactive-ion-etching (RIE), ion beam etching, plasma etching or laser ablation. During the etching process, the pattern is first transferred to the dielectric layer. The patterned photoresist is typically, but not necessarily, removed from the structure after the pattern has been transferred into the dielectric film. The patterned feature formed into the dielectric material includes the contact holes and/or trenches.

The substrate 10 can be a processed wafer. A "processed wafer" is herein defined as a wafer that has undergone semiconductor front end of line processing (FEOL) middle of the line processing (MOL), wherein the various desired devices have been formed.

The dielectric layer 12 can comprise any dielectric including inorganic dielectrics or organic dielectrics. Some examples of suitable dielectrics that can be used as the dielectric material include, but are not limited to: $SiO_2$, silsesquioxanes, carbon doped oxides (i.e., organosilicates) that include atoms of Si, C, O and H, thermosetting polyarylene ethers, or multilayers thereof. The term "polyarylene" is used to denote aryl moieties or inertly substituted aryl moieties which are linked together by bonds, fused rings, or inert linking groups such as, for example, oxygen, sulfur, sulfone, sulfoxide, carbonyl and the like. The dielectric can be deposited by PECVD procedures as is generally known in the art. These patterned features correspond to the subsequent interconnect vias (i.e., metal plugs between levels) and can be aligned with underlying source and/or drain regions or over a metal gate structure defined by the particular substrate 10.

Figure 1B:
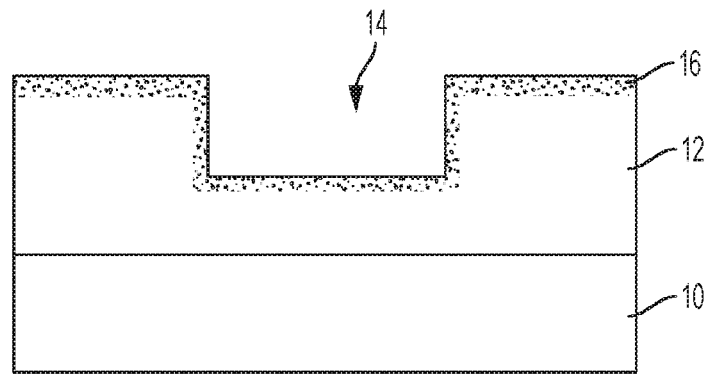
FIG. 1B depicts a schematic cross-sectional view illustrating the structure of FIG. 1A after formation of a point defect region in the dielectric layer.

Referring now to FIG. 1B, after removal of the photoresist used to create the open trench 14 via plasma ashing and/or wet cleaning, the exposed surfaces of the dielectric layer 12 are subject to a low energy particle bombardment process to create point defects in a portion of the dielectric layer and to simultaneously deposit Si, C, N, O and mixtures thereof within a penetrated region 16 defined by the point defects. The low energy particles formed in the low energy particle bombardment process are electrically neutral and create point defects such as pores, cracks, and the like at a relatively shallow depth of the dielectric layer.

Figure 1C:
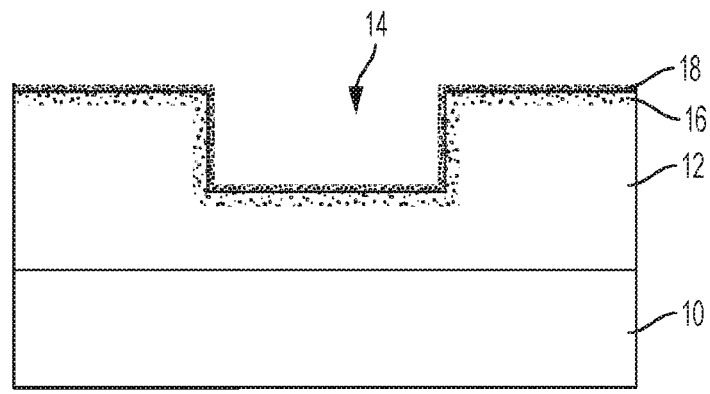
FIG. 1C depicts a schematic cross-sectional view illustrating the structure of FIG. 1B after formation of a seed layer on the dielectric layer.

As shown in FIG. 1C, a seed layer 18 is conformally deposited onto the patterned dielectric layer including the top planar dielectric surface, the trench sidewalls, and the trench bottom surface. It should be apparent that depending on the type of opening in the dielectric layer, e.g., trench, via, and the like, the bottom surface can be defined by a source region or a drain region or a metal gate or the dielectric layer The function of the seed layer is to provide a base onto which a main conductor layer can be deposited and includes elements that react with the Si, C, N, O and mixtures thereof within the penetrated region 16 to form an in situ liner layer within the dielectric layer. The seed layer can be deposited by atomic layer deposition (ALD), sputter deposition, plasma vapor deposition (PVD), chemical vapor deposition (CVD) or the like.

Suitable seed layers are generally chosen to provide improved electromigration resistance, improved adhesion to the underlying liner layer, and improved surface properties suitable for deposition of the main conductor copper body. Exemplary copper alloys that have been shown to improve the electromigration resistance relative to pure copper, include Cu (Sn), Cu (In), Cu (zr), Cu (Ti) and Cu (C, N, O, Cl, S). Exemplary seed layers that improve the adhesion properties relative to pure copper which include Cu (Al), Cu (Mg), and alloys of Cu with other reactive metals such as Be, Ca, Sr, Ba, Sc, Y, La, and rare earth series elements of Ce, Pr, Nd, Sm, Eu, Gd, Tb, Dy, Ho, Er, Tm, Yb and Lu, and Hf, V, Mb, Ta, Cr, Mo, W, Mn, Re, Si and Ge. The seed layer can include additional alloying elements that improve surface properties for the seed layer such as B, O, N, P, Fe, Ru, Os, Co, Rh, Jr, Ni, Pd, Pt, Ag, Au, Zn and Cd.

In one or more embodiments, the seed layer 18 includes a metal conductor and at least one alloying element selected from the group consisting Al, Mn, Ni or mixtures thereof. Uniformity of seed layer is typically desired, since a poor seed layer can result in voids. It is also desirable to ensure that the seed layer surface is free of oxides for efficient charge transfer during plating.

Figure 1D:
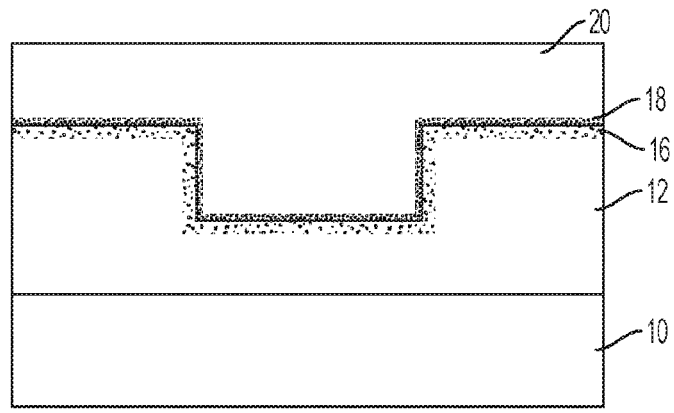
FIG. 1D depicts a schematic cross-sectional view illustrating the structure of FIG. 1C subsequent to formation of a metal conductor on the seed layer.

On top of seed layer 18, a conductive metal layer 20 (i.e., conductor) is deposited. As shown in FIG. 1D, this metal layer can be deposited onto the surface by an electrochemical deposition process. Other processes such as e-beam evaporative deposition, physical vapor deposition, or CVD, can be used to deposit the metal layer. The conductive metal fills the trench feature 14. In addition, a metal layer is formed over the top surfaces of the dielectric layer, which is also referred to as the overburden. Exemplary conductive metals suitable for the interconnect structure includes low resistivity materials such as copper, aluminum, tungsten, cobalt, ruthenium, iridium, rhodium, mixtures thereof and the like.

Figure 1E:
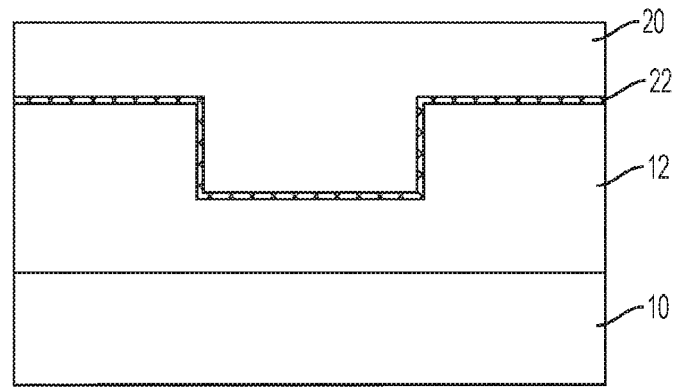
FIG. 1E depicts a schematic cross-sectional view illustrating the structure of FIG. 1D subsequent to an anneal process to form an in situ liner layer within the dielectric layer.

In one or more embodiments, the substrate is then subjected to an annealing process, which will generally remove the point defect region and form an in situ liner layer 22 within the dielectric layer 12 as shown in FIG. 1E. The Si, C, N, O, and mixtures thereof in the point defect region 16 react with one or more of the alloying elements in the seed layer to form the liner layer 22. The one or more alloying elements in the seed layer can diffuse into the point defect region to react with the Si, C, N, O, and mixtures thereof so as to form the liner layer within the dielectric layer 12, thereby maximizing the volume fraction of the metal conductor within the trench feature.

Additionally, the anneal process improves various properties of the metal conductor such as providing an increased grain size so as to increase conductivity, reducing stress, and reducing electromigration. The annealing process generally includes heating the substrate at an elevated temperature typically less than 400° C. in an inert atmosphere for a defined period of time of about sixty minutes or less. Ovens, furnaces, rapid thermal processing equipment and the like can be utilized for the annealing process.

Figure 1F:
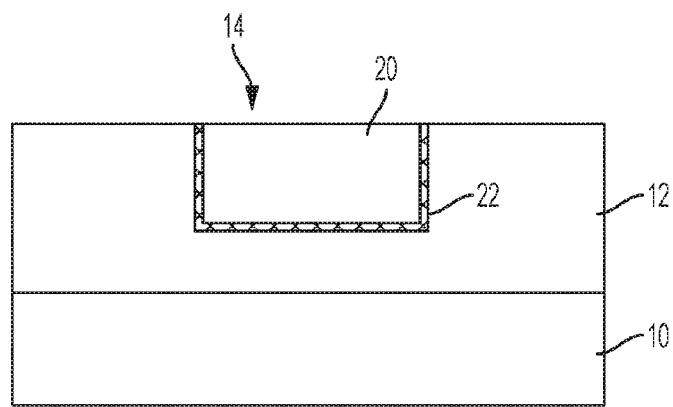
FIG. 1F depicts a schematic cross-sectional view illustrating the structure of FIG. 1E subsequent to a chemical mechanical process.

After annealing, a chemical mechanical polishing (CMP) process is then utilized to remove the overburden and portions of the liner layer formed at the top surface of the dielectric layer as shown in FIG. 1F. The CMP process planarizes the surface of the interconnect structure by a combination of chemical and mechanical forces generally known in the art. By way of example, CMP can remove material through the physical grinding of a slurry containing abrasive particles such as silica, as well as through chemical action as a result of oxidizing agents such as hydrogen peroxide contained in the slurry. The trench feature in the resulting interconnect structure includes a liner layer formed within the dielectric layer, the seed layer, and the metal conductor.

Figure 1G:
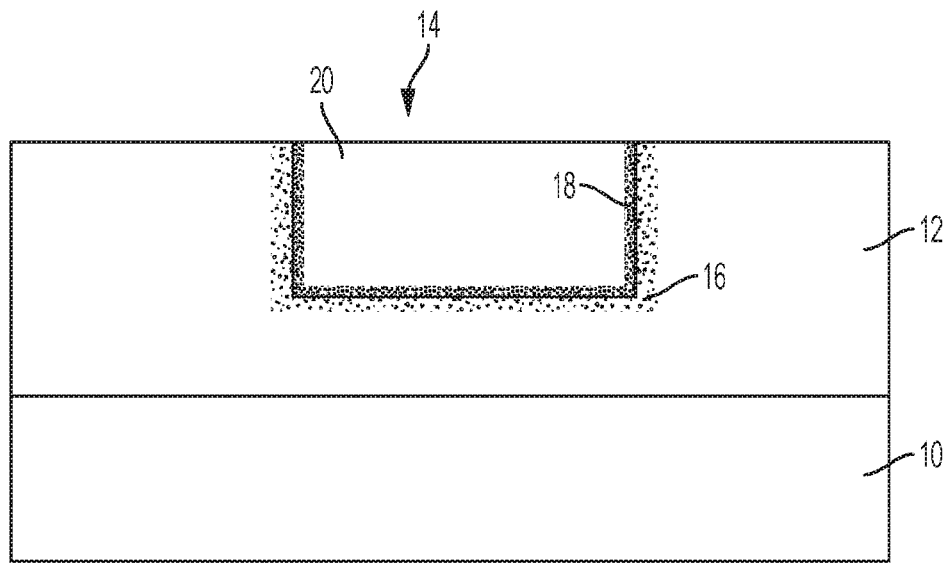
FIG. 1G depicts a schematic cross-sectional view illustrating the structure of FIG. 1D subsequent to a chemical mechanical process in accordance with one or more other embodiments.

Optionally, the CMP process can occur prior to the annealing process. Turning now to FIG. 1G, the CMP process is utilized to first remove the overburden, the seed layer, and the point defect region 16 previously formed on the topmost surface of the dielectric layer 12. As a result, the trench feature 14 includes the point defect region in the sidewalls thereof as well as in the bottom surface of the dielectric layer. Likewise, the seed layer is formed on the sidewalls and bottom surface of the dielectric layer 12.

Figure 1H:
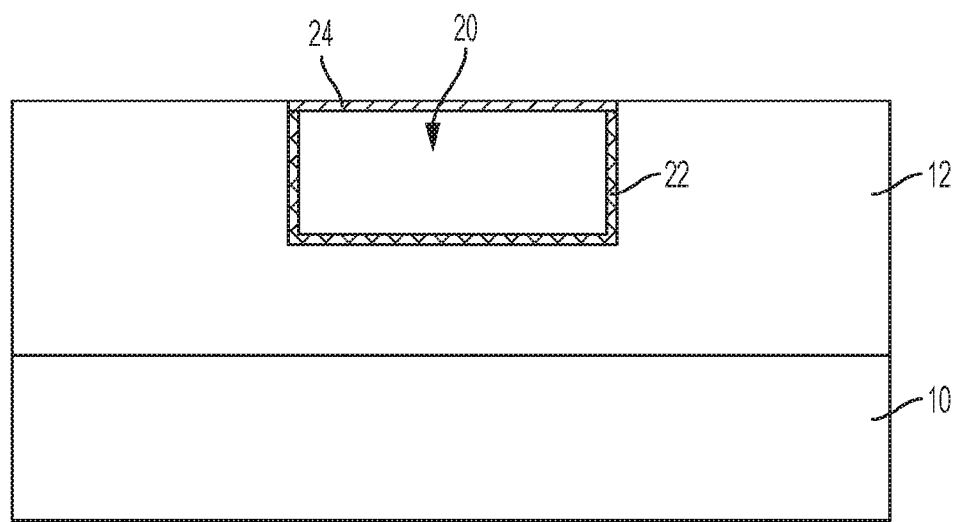
FIG. 1H depicts a schematic cross-sectional view illustrating the structure of FIG. 1G subsequent to an anneal process to form an in situ liner layer within the dielectric layer and an alloy liner on a top surface of the conductor.

In FIG. 1H, the annealing process occurs subsequent to the CMP process and results in diffusion of portion of the alloying elements from the seed layer into the point defect region, wherein Si, C, N, O, and mixtures thereof were previously deposited so as to form the liner layer 22 on the sidewalls and bottom surface of the trench feature 14. In addition, because CMP occurs prior to the anneal process, the top surface of the conductor 20 includes liner layer 24 containing one or more alloy elements in the deposited seed layer 18, e.g. Mn, Al, Ni or mixture of the same. Annealing effects migration of the one or more alloying elements to the top (exposed) surface of the conductor 20 and functions as a liner layer.

Turning now to FIGS. 2A-I, there is shown an interconnect structure and process of manufacture in accordance with one or more embodiments, wherein a relatively thin conformal liner layer is deposited onto the dielectric layer (i.e., onto the point defect region) such that the resulting liner layer can defined by a combination of an in situ liner layer formed within the dielectric layer as generally described above and the deposited conformal liner layer, which is a different material and can be tailored to provide effective electromigration resistance of the metal conductor into the dielectric layer.

Figure 2A:
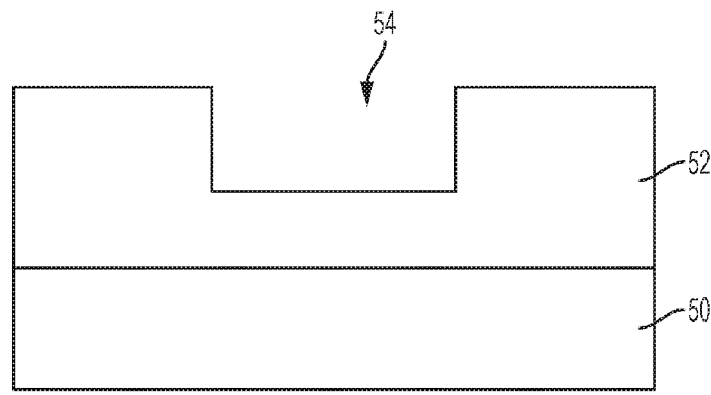
FIG. 2A depicts a schematic cross-sectional view illustrating an opening in the form of a trench formed in a dielectric layer according to one or more embodiments.

As shown in FIG. 2A, the process generally includes begins with forming an open trench feature 54 and/or contact feature (not shown) in a dielectric layer 52 deposited on a substrate 50 and patterned through conventional lithography and etching processes as previously discussed.

Figure 2B:
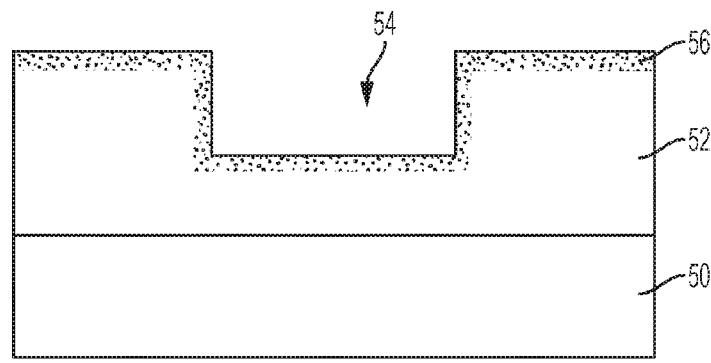
FIG. 2B depicts a schematic cross-sectional view illustrating the structure of FIG. 2A after formation of a point defect region in the dielectric layer.

Referring now to FIG. 2B, the exposed surfaces of the dielectric layer 52 are subject to a low energy particle bombardment process in the manner previously described to create a point defect region 56 in a portion of the dielectric layer 52 and to simultaneously deposit Si, C, N, O and mixtures thereof within the point defect region 56 of the dielectric layer 52. The low energy particles formed in the low energy particle bombardment process are electrically neutral and create point defects such as pores, cracks, and the like at a relatively shallow depth of the dielectric layer 52.

Figure 2C:
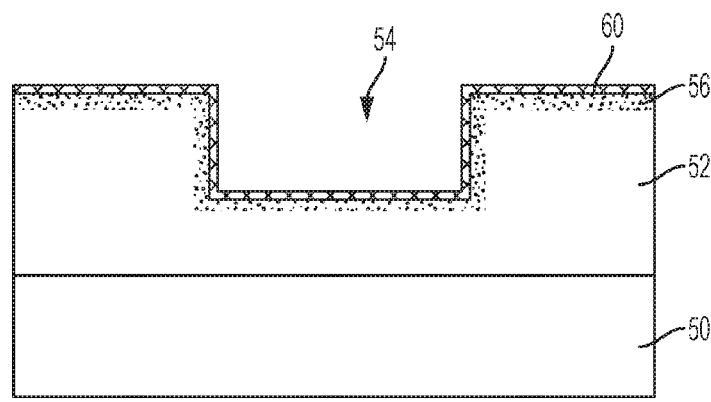
FIG. 2C depicts a schematic cross-sectional view illustrating the structure of FIG. 2B after deposition of a conformal liner layer on all of the exposed surfaces.

As shown in FIG. 2C, a relatively thin liner layer 60 is conformally deposited onto the dielectric layer 52 such that a multilayered liner layer can be formed, which is defined by a combination of an in situ liner layer formed within the dielectric layer and the thin conformal liner layer 30 deposited onto the dielectric layer 52 as will be discussed in greater detail below. The liner layer 30 can be formed from tantalum (Ta), titanium (Ti), ruthenium (Ru), iridium (Ir) tungsten (W), cobalt (Co), mixtures thereof, and the like. The thin conformal liner layer 60 can be deposited through conventional deposition processes such as, for example, a plasma vapor deposition process such as R.F. sputtering, chemical vapor deposition, atomic layer deposition, and the like. In one or more embodiments, the thickness of the deposited liner layer is between 5 Angstroms (Å) and 40 Å. In one or more other embodiments, the thickness of the deposited liner layer is between 10 Å and 20 Å. In one or more other embodiments, the thickness of the deposited liner layer is less than 15 Å.

Figure 2D:
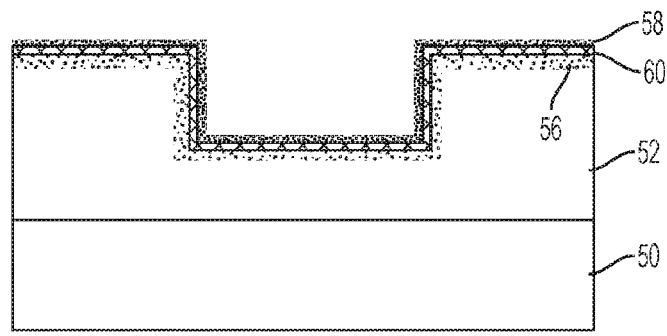
FIG. 2D depicts a schematic cross-sectional view illustrating the structure of FIG. 2C after deposition of a seed layer onto the conformal liner layer.

In FIG. 2D, a seed layer 58 is conformally deposited onto the relatively thin conformal liner layer 60 and includes alloying elements that can react with the Si, C, N, O and mixtures thereof in the point defect region 56. The seed layer can be deposited by atomic layer deposition (ALD), sputter deposition, CVD, PVD or the like.

In one or more embodiments, the seed layer 58 includes a metal conductor and at least one alloying element selected from the group consisting Al, Mn, Ni or mixtures thereof.

Figure 2E:
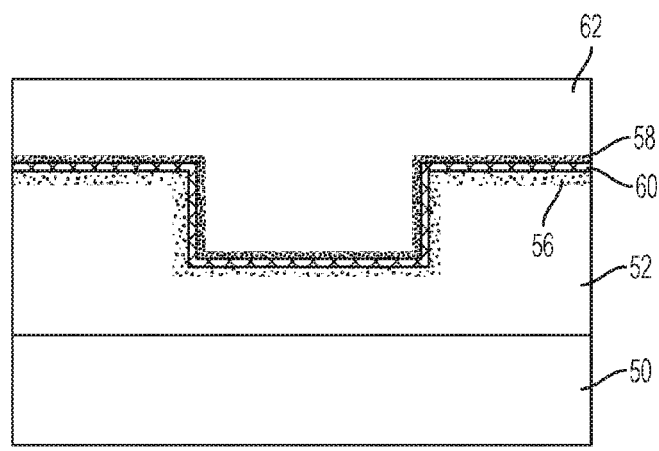
FIG. 2E depicts a schematic cross-sectional view illustrating the structure of FIG. 2D subsequent to formation of a metal conductor on the seed layer.

On top of seed layer 58, a conductive metal layer 62 is deposited. As shown in FIG. 2E, which can be deposited onto the surface by an electrochemical deposition process (also referred to as electroplating), e-beam evaporative deposition, physical vapor deposition, CVD, or the like. The conductive metal fills the trench feature 54 and forms an overburden on the top surface of the dielectric layer 52.

Figure 2F:
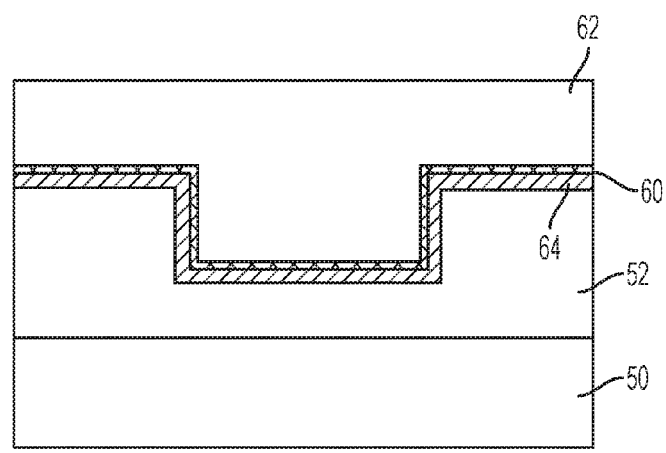
FIG. 2F depicts a schematic cross-sectional view illustrating the structure of FIG. 2E subsequent to an anneal process to form an in situ liner layer within the dielectric layer.

In one or more embodiments, the substrate is then subjected to an annealing process to remove the point defect region and form an in situ liner layer 64 within the dielectric layer 52 as shown in FIG. 2F, which is in addition to the liner layer 60 previously deposited.

Figure 2G:
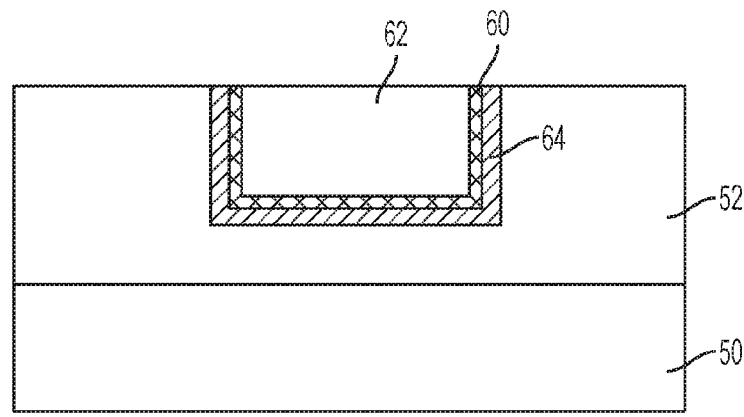
FIG. 2G depicts a schematic cross-sectional view illustrating the structure of FIG. 2F subsequent to a chemical mechanical process.

After annealing, a chemical mechanical polishing (CMP) process is then utilized to remove excess metal conductive material 62 from the top surface of the dielectric layer 52, which includes the overburden, the liner layer 60, the seed layer 58, and the in situ liner layer 64 as shown in FIG. 2G. The CMP process planarizes the surface of the interconnect structure by a combination of chemical and mechanical forces generally known in the art. The resulting interconnect structure includes a trench feature including a liner layer formed of in situ liner layer 64 and the previously deposited thin liner layer 60, the seed layer 58, and the metal conductor 62.

Figure 2H:
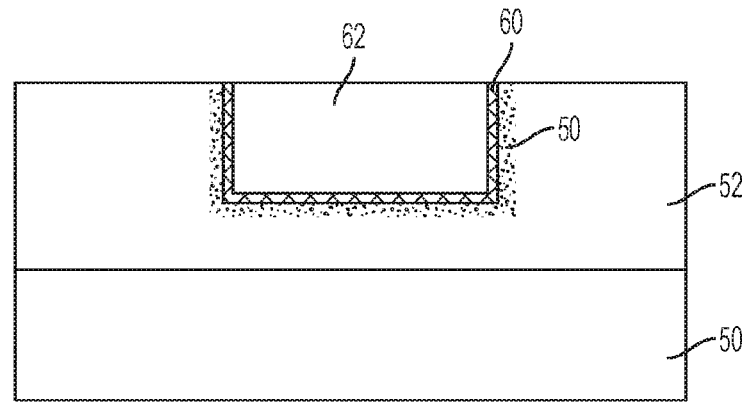
FIG. 2H depicts a schematic cross-sectional view illustrating the structure of FIG. 2E subsequent to a chemical mechanical process in accordance with one or more other embodiments.

Optionally, the CMP process can occur prior to the annealing process. Turning now to FIG. 2H, the CMP process is first utilized to remove the overburden, the liner layer 60, and the seed layer 58 on the topmost surface of the dielectric layer 52 as well as the point defect region 56 within the dielectric layer 52.

Figure 2I:
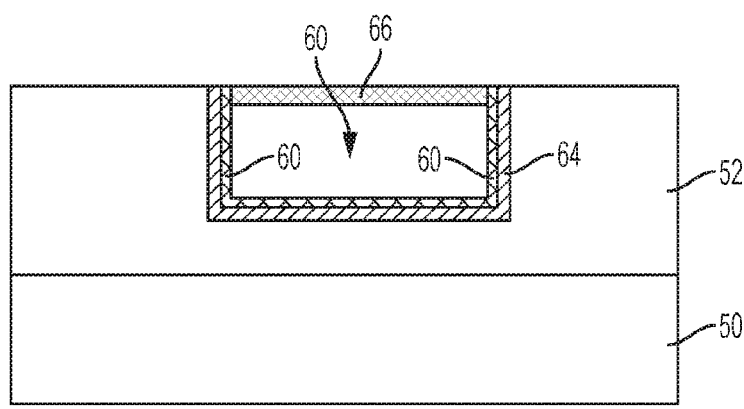
FIG. 2I depicts a schematic cross-sectional view illustrating the structure of FIG. 2H subsequent to an anneal process to form an in situ liner layer within the dielectric layer and on a top surface of the conductor.

In FIG. 2I, the annealing process occurs subsequent to the CMP process and results in diffusion of the alloying elements in the seed layer components such as Al, Mn, Ni and the like into the point defect region 56 to form liner layer 64 in addition to the previously deposited liner layer 60. Additionally, annealing after CMP results in migration of the one or more alloying elements, e.g., Mn, Al, Ni or mixture of the same, from the seed layer 58 to the top (exposed) surface of the conductor 60 and forms liner layer 66. A portion of the alloying elements in the seed layer can diffuse from the sidewalls of the trench metal top surface.

All ranges described herein are inclusive of the endpoints, and the endpoints are combinable with each other.

All cited patents, patent applications, and other references are incorporated herein by reference in their entirety.

The use of the terms "a" and "an" and "the" and similar referents in the context of describing the invention (especially in the context of the following claims) are to be construed to cover both the singular and the plural, unless otherwise indicated herein or clearly contradicted by context. Further, it should further be noted that the terms "first," "second," and the like herein do not denote any order, quantity, or importance, but rather are used to distinguish one element from another.

While the preferred embodiment to the disclosure has been described, it will be understood that those skilled in the art, both now and in the future, can make various improvements and enhancements which fall within the scope of the claims which follow. These claims should be construed to maintain the proper protection for the invention first described.

The invention claimed is:

1. A method for forming an interconnect structure in an integrated circuit comprising:
   providing a patterned substrate comprising an opening in a dielectric layer, wherein the opening includes sidewalls formed of the dielectric layer and a bottom surface comprising a source region or a drain region or a metal gate or the dielectric layer;
   creating point defects in exposed surfaces of the dielectric layer to create a point defect region, wherein the point defect region is a fraction of the dielectric layer and is created with exposure to silicon, carbon, nitrogen, oxygen, or mixtures thereof such that the point defect region contains Si, C, N O, or mixtures containing at least one of the foregoing;
   depositing a seed layer onto the point defect region, wherein the seed layer comprises at least one alloying element;
   depositing a conductor layer onto the seed layer; and
   annealing the patterned substrate to form an in situ liner layer in the point defect region of the dielectric layer from the at least one alloying element and Si, C, N O, or mixtures containing at least one of the foregoing.

2. The method of claim 1, further comprising depositing a conformal liner layer onto the dielectric layer at a thickness of less than 40 Angstroms, wherein depositing the conformal layer is after creating the point defects in the exposed surfaces of the dielectric layer.

3. The method of claim 2, wherein the conformal liner layer deposited onto the dielectric layer is formed of a metal comprising tantalum, ruthenium, rhodium, iridium, cobalt, or mixtures comprising at least one of the foregoing.

4. The method of claim 1, wherein the at least one alloying element in the seed layer comprises aluminum, manganese, nickel or mixtures thereof.

5. The method of claim 1, wherein creating the point defects comprises penetrating the exposed surfaces of the dielectric layer with particles to a depth of less than 10 nanometers.

6. The method of claim 1, wherein creating the point defects comprises penetrating the exposed surfaces of the dielectric layer with particles to a depth of greater than 0.5 nanometers to less than 3 nanometers.

7. The method of claim 1, wherein the creating the point defects comprises ion implantation at energies of 10 keV to 200 keV, plasma bombardment at energies of 0.1 keV to 2 keV, gas cluster ion bombardment at energies of 10 keV to 30 keV and accelerated neutral atom beam at energies of 10 eV to 200 eV.

8. The method of claim 1, wherein creating the point defects comprises exposing the dielectric layer to particles in an amount and at an energy effective to form pores and/or cracks in the dielectric layer.

9. The method of claim 3, wherein exposing the dielectric layer to particles comprises an accelerated neutral atom beam at energies of 10 eV to 200 eV, wherein the particles are electrically neutral.

10. The method of claim 1, further comprising chemical mechanically polishing after the annealing to remove an overburden of the conductor layer, the in situ liner layer, and the seed layer from an uppermost surface of the dielectric layer.

11. The method of claim 1, further comprising chemical mechanically polishing prior to the annealing to remove an overburden of the conductor layer and the seed layer from an uppermost surface of the dielectric layer, wherein the annealing further forms a liner layer on a top surface of the conductor layer.

12. The method of claim 1, further comprising chemical mechanically polishing prior to the annealing to remove an overburden of the conductor layer and the seed layer from an uppermost surface of the dielectric layer, wherein the annealing further forms a second liner layer from the at least one alloying element on a top surface of the conductor layer.

* * * * *